(12) United States Patent
Igarashi

(10) Patent No.: US 10,564,205 B2
(45) Date of Patent: Feb. 18, 2020

(54) VOLTAGE ABNORMALITY DETECTION CIRCUIT AND SEMICONDUCTOR DEVICE

(71) Applicant: SII Semiconductor Corporation, Chiba-shi, Chiba (JP)

(72) Inventor: Atsushi Igarashi, Chiba (JP)

(73) Assignee: ABLIC INC., Chiba (JP)

( * ) Notice: Subject to any disclaimer, the term of this patent is extended or adjusted under 35 U.S.C. 154(b) by 180 days.

(21) Appl. No.: 15/784,344

(22) Filed: Oct. 16, 2017

(65) Prior Publication Data
US 2018/0172749 A1   Jun. 21, 2018

(30) Foreign Application Priority Data

Dec. 15, 2016 (JP) .................................. 2016-243668

(51) Int. Cl.
| G01R 31/02 | (2006.01) |
|---|---|
| G01R 17/02 | (2006.01) |
| G05F 1/625 | (2006.01) |
| G01R 31/42 | (2006.01) |
| G01R 31/40 | (2020.01) |

(52) U.S. Cl.
CPC .............. *G01R 31/02* (2013.01); *G01R 17/02* (2013.01); *G01R 31/40* (2013.01); *G01R 31/42* (2013.01); *G05F 1/625* (2013.01)

(58) Field of Classification Search
CPC ........ G01R 31/40; G01R 31/42; G01R 31/02; G01R 19/16566; G01R 19/16552
See application file for complete search history.

(56) References Cited

U.S. PATENT DOCUMENTS

| 8,368,381 B1* | 2/2013 | Becvar | G06F 3/0312 |
|---|---|---|---|
| | | | 324/76.11 |
| 2008/0212246 A1* | 9/2008 | Tanaka | G01R 31/025 |
| | | | 361/86 |
| 2010/0085060 A1* | 4/2010 | Ichikawa | G01R 31/3277 |
| | | | 324/503 |
| 2010/0201331 A1 | 8/2010 | Imura | |
| 2011/0234255 A1* | 9/2011 | Chobot | G01R 31/40 |
| | | | 324/764.01 |
| 2015/0115996 A1* | 4/2015 | Lin | G01R 31/40 |
| | | | 324/764.01 |
| 2015/0260802 A1* | 9/2015 | Mitani | G01R 19/0084 |
| | | | 324/76.11 |

FOREIGN PATENT DOCUMENTS

| JP | 2001-092544 A | 4/2001 |
|---|---|---|
| JP | 5421133 B2 | 2/2014 |

* cited by examiner

*Primary Examiner* — Jeff W Natalini
(74) *Attorney, Agent, or Firm* — Brinks Gilson & Lione

(57) ABSTRACT

In order to provide a voltage abnormality detection circuit and a semiconductor device which are capable of detecting a voltage abnormality in an internal power supply voltage of the semiconductor device with a simple circuit configuration, the voltage abnormality detection circuit includes: a reference voltage circuit configured to output a first reference voltage, which is higher than the internal power supply voltage, and a second reference voltage, which is lower than the internal power supply voltage; a first voltage detection circuit configured to detect that the internal power supply voltage has exceeded a desired voltage value, with the use of the first reference voltage; and a second voltage detection circuit configured to detect that the internal power supply voltage has dropped lower than the desired voltage value, with the use of the second reference voltage.

4 Claims, 5 Drawing Sheets

VOLTAGE ABNORMALITY DETECTION CIRCUIT AND SEMICONDUCTOR DEVICE

RELATED APPLICATIONS

This application claims priority under 35 U.S.C. § 119 to Japanese Patent Application No. 2016-243668 filed on Dec. 15, 2016, the entire content of which is hereby incorporated by reference.

BACKGROUND OF THE INVENTION

1. Field of the Invention

The present invention relates to a voltage abnormality detection circuit configured to detect an abnormality in the output voltage of a voltage regulator, and a semiconductor device.

2. Description of the Related Art

There is known a semiconductor device in which an internal circuit is driven by an internal power supply voltage output from a voltage regulator (Japanese Patent Application Laid-open No. 2001-92544).

The voltage regulator includes a reference voltage circuit, an output transistor, a voltage dividing resistor, and a differential amplifier to output a desired internal power supply voltage stably.

The semiconductor device of the related art, however, cannot detect an abnormality occurred in a circuit of the voltage regulator, for example, an abnormality in the reference voltage circuit or an abnormality in the voltage dividing resistor.

SUMMARY OF THE INVENTION

The present invention provides a voltage abnormality detection circuit configured to detect an abnormality in an internal power supply voltage output from a voltage regulator, and a semiconductor device having a voltage abnormality detection circuit.

According to one embodiment of the present invention, there is provided a voltage abnormality detection circuit comprising:

a reference voltage circuit configured to output a first reference voltage which is higher than the internal power supply voltage, and a second reference voltage which is lower than the internal power supply voltage;

a first voltage detection circuit to which the first reference voltage is input, and which is configured to detect that the internal power supply voltage is higher than a first voltage value; and a second voltage detection circuit to which the second reference voltage is input, and which is configured to detect that the internal power supply voltage is lower than a second voltage value.

According to the voltage abnormality detection circuit of the present invention which includes the reference voltage circuit, the first voltage detection circuit, and the second voltage detection circuit, a voltage abnormality in the internal power supply voltage of a semiconductor device can be detected with a simple circuit configuration.

DETAILED DESCRIPTION OF THE PREFERRED EMBODIMENTS

Now, a voltage abnormality detection circuit of the present invention is described with reference to the drawings.

Figure 1:
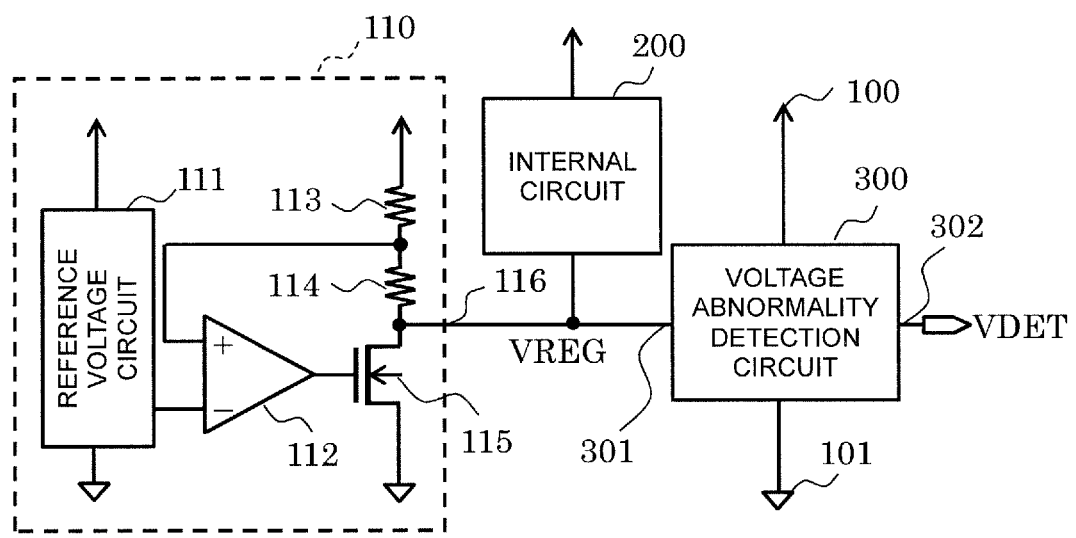
FIG. 1 is a block diagram for illustrating a semiconductor device that includes a voltage abnormality detection circuit according to the present invention.

FIG. 1 is a block diagram for illustrating a semiconductor device that includes the voltage abnormality detection circuit according to the present invention.

The semiconductor device according to the present invention includes a voltage regulator 110, an internal circuit 200, and a voltage abnormality detection circuit 300.

The voltage regulator 110 includes a reference voltage circuit 111, a differential amplifier 112, resistors 113 and 114, an output transistor 115, and an output terminal 116. The voltage regulator 110 operates on a voltage between power supply terminals 100 and 101 to output a constant voltage VREG relative to the power supply terminal 100 from the output terminal 116.

The internal circuit 200 operates on the constant voltage VREG.

The voltage abnormality detection circuit 300 includes an input terminal 301 to which the constant voltage VREG is input and an output terminal 302. The voltage abnormality detection circuit 300 operates on a voltage between the power supply terminals 100 and 101 to output a detection voltage VDET from the output terminal 302.

The semiconductor device according to the present invention is thus configured to outputs the detection voltage VDET on the detection of an abnormality in the constant voltage VREG which is an output from the voltage regulator 110.

First Embodiment

Figure 2:
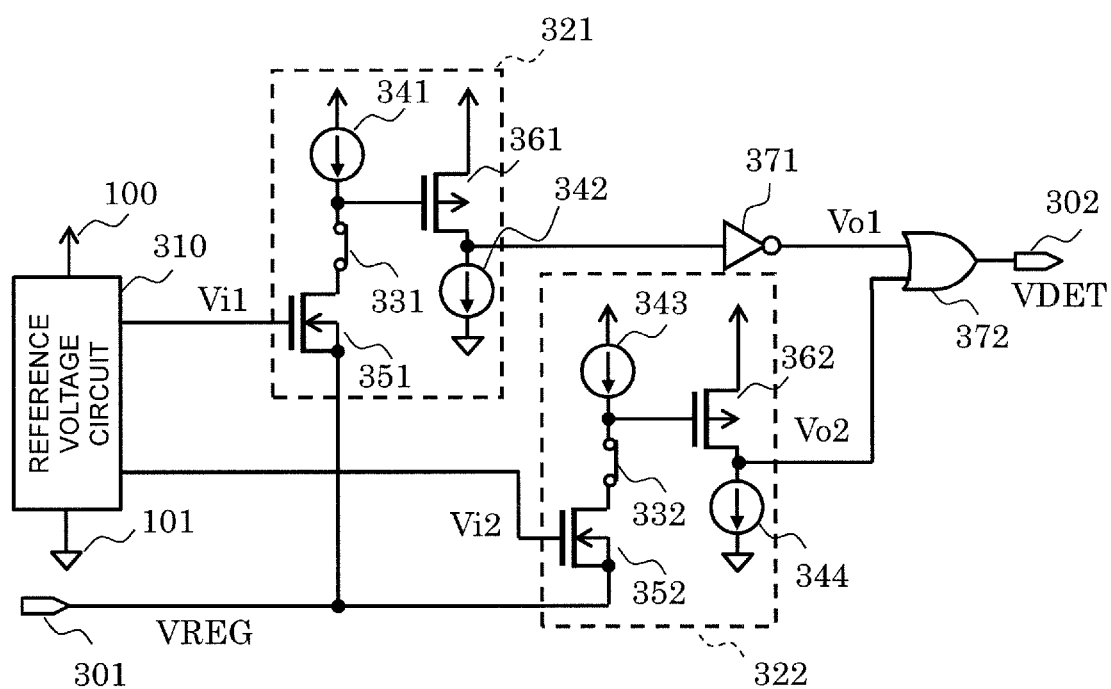
FIG. 2 is a circuit diagram for illustrating a voltage abnormality detection circuit according to a first embodiment of the present invention.

FIG. 2 is a circuit diagram for illustrating a voltage abnormality detection circuit according to a first embodiment of the present invention.

A voltage abnormality detection circuit 300a according to the first embodiment includes a reference voltage circuit 310, a first voltage detection circuit 321, a second voltage detection circuit 322, an inverter circuit 371, and an OR circuit 372. The reference voltage circuit 310 is configured to output a first reference voltage which is higher than a desired internal power supply voltage, and a second reference voltage which is lower than the desired internal power supply voltage.

The first voltage detection circuit 321 includes a first input terminal to which the first reference voltage of the reference voltage circuit 310 is input, and a second input terminal to which the voltage of the input terminal 301, namely, the constant voltage VREG, is input. The second voltage detection circuit 322 includes a first input terminal to which the second reference voltage of the reference voltage circuit 310 is input, and a second input terminal to which the constant voltage VREG is input. The inverter circuit 371 includes an input terminal which is connected to an output terminal of the first voltage detection circuit 321. The OR circuit 372 includes a first input terminal, which is connected to an output terminal of the inverter circuit 371, a second input terminal, which is connected to an output terminal of the second voltage detection circuit 322, and an output terminal, which is connected to the output terminal 302.

The first voltage detection circuit 321 includes a constant current source 341, a constant current source 342, an NMOS transistor 351, a PMOS transistor 361, and a switch 331.

The NMOS transistor 351 includes a gate, which is connected to the first input terminal of the first voltage detection circuit 321, a source and a bulk, which are connected to the second input terminal of the first voltage detection circuit 321, and a drain, which is connected to one end of the switch 331. The other end of the switch 331 is connected to one end of the constant current source 341 and a gate of the PMOS transistor 361. The other end of the constant current source 341 is connected to the power supply terminal 100. The PMOS transistor 361 includes a source, which is connected to the power supply terminal 100, and a drain, which is connected to one end of the constant current source 342 and to the output terminal of the first voltage detection circuit 321. The other end of the constant current source 342 is connected to the power supply terminal 101.

The second voltage detection circuit 322 includes a constant current source 343, a constant current source 344, an NMOS transistor 352, a PMOS transistor 362, and a switch 332. Those elements of the second voltage detection circuit 322 are connected to terminals and electrodes in a manner similar to how the elements of the first voltage detection circuit 321 are connected to terminals and electrodes.

The operation of the voltage abnormality detection circuit 300a according to the first embodiment is described next.

Figure 3:
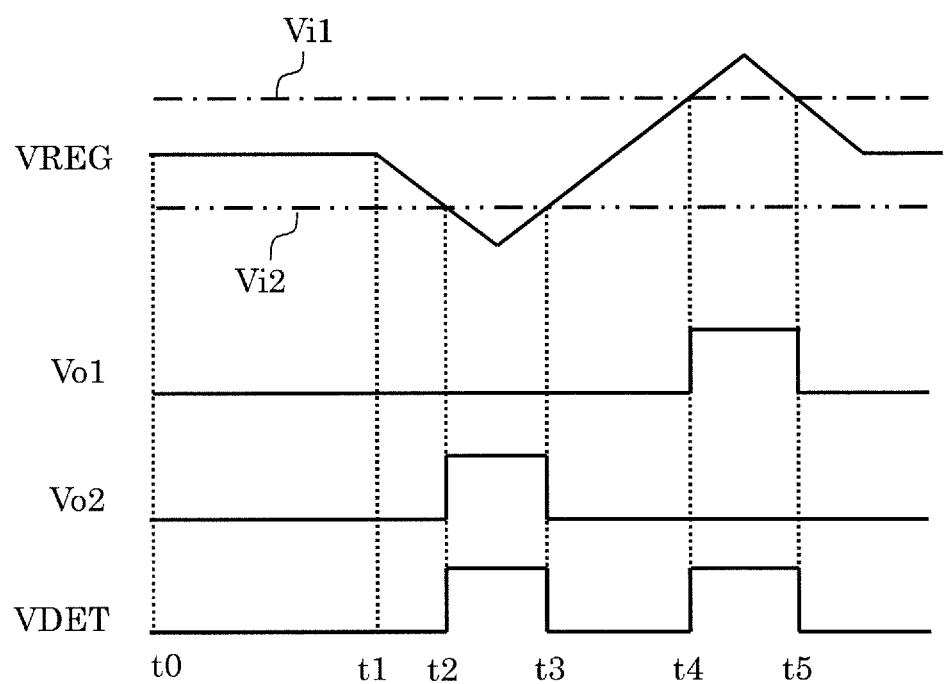
FIG. 3 is a timing chart for illustrating the operation of the voltage abnormality detection circuit according to the first embodiment.

FIG. 3 is a timing chart for illustrating the operation of the voltage abnormality detection circuit 300a according to the first embodiment. The voltages of the first input terminal in the first voltage detection circuit 321 is denoted by Vi1, and the voltage of the output terminal of the inverter circuit 371 is denoted by Vo1. The voltage of the first input terminal and the output terminal in the second voltage detection circuit 322 are denoted by Vi2 and Vo2, respectively.

The first reference voltage of the reference voltage circuit 310 is adjusted to a voltage value that is higher than the internal power supply voltage and that does not cause malfunction of the internal circuit. The second reference voltage of the reference voltage circuit 310 is adjusted to a voltage that is lower than the internal power supply voltage and that does not cause dielectric breakdown of the internal circuit. The switches 331 and 332 are both switched on.

A case in which there is no abnormality in the voltage regulator 110 is considered. When Vi1−VREG>Vth holds as in a period from a time t0 to a time t1 in FIG. 3, the NMOS transistor 351 is turned on and the PMOS transistor 361 is turned on in the first voltage detection circuit 321, thereby setting the voltage Vo1 to the Low level. In the second voltage detection circuit 322, the NMOS transistor 352 is turned off and the PMOS transistor 362 is turned off because Vi2−VREG<Vth holds, thereby setting the voltage Vo2 to the Low level. The detection voltage VDET of the output terminal 302 is consequently at the Low level.

Next, discussion is made of a case in which an abnormality occurs in the voltage regulator circuit to cause the constant voltage VREG to drop lower than the second reference voltage of the reference voltage circuit 310. The voltage Vo1 remains at the Low level from a time t2 to a time t3 in FIG. 3. When Vi2−VREG>Vth holds, however, the NMOS transistor 352 is turned on and the PMOS transistor 362 is turned on in the second voltage detection circuit 322, thereby setting the voltage Vo2 to the High level. The detection voltage VDET is consequently at the High level, which indicates that a voltage abnormality in the voltage regulator 110 can be detected.

Next, discussion is made of a case in which an abnormality occurs in the voltage regulator circuit to cause the constant voltage VREG to exceed the first reference voltage of the reference voltage circuit 310. When Vi1−VREG<Vth holds as in a period from a time t4 to a time t5 in FIG. 3, the NMOS transistor 351 is turned off and the PMOS transistor 361 is turned off in the first voltage detection circuit 321, thereby setting the voltage Vo1 to the High level. When Vi2−VREG<Vth holds, on the other hand, the NMOS transistor 352 is turned off and the PMOS transistor 362 is turned off in the second voltage detection circuit 322, thereby setting the voltage Vo2 to the Low level. The detection voltage VDET is consequently at the High level, which indicates that a voltage abnormality in the voltage regulator 110 can be detected.

As described above, the voltage abnormality detection circuit 300a according to the first embodiment includes the first voltage detection circuit 321 and the second voltage detection circuit 322, and is thus capable of detecting that a voltage abnormality in the voltage regulator 110 has caused the internal power supply voltage to deviate from a desired voltage range.

The switches 331 and 332, which are switched on in the description given above, may instead be controlled so as to switch on only for a case in which the voltage regulator circuit should be monitored for the abnormality, which makes the semiconductor device consume less current.

Second Embodiment

Figure 4:
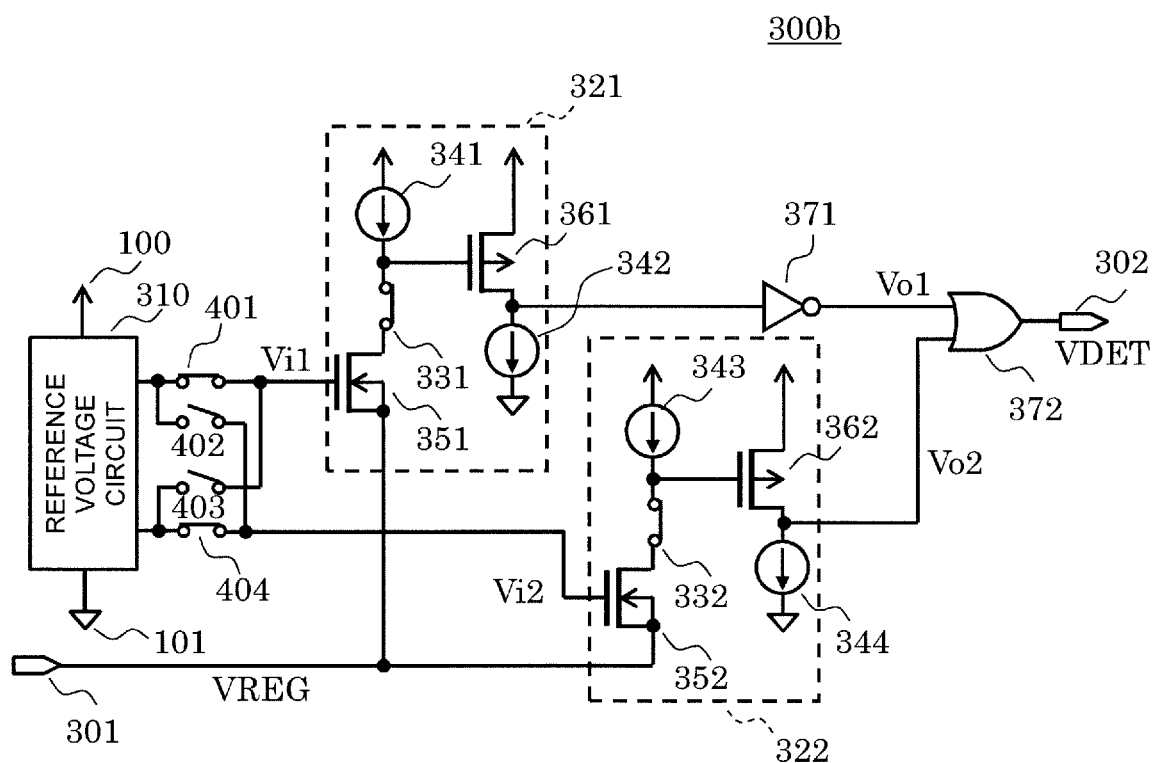
FIG. 4 is a circuit diagram for illustrating a voltage abnormality detection circuit according to a second embodiment of the present invention.

FIG. 4 is a circuit diagram for illustrating a voltage abnormality detection circuit according to a second embodiment of the present invention. The difference from the voltage abnormality detection circuit 300a according to the first embodiment is that a switch circuit, which includes switches 401, 402, 403, and 404, is added.

One end of the switch 401 is connected to a first output terminal of the reference voltage circuit 310, and the other end of the switch 401 is connected to the first input terminal of the first voltage detection circuit 321. One end of the switch 402 is connected to the first output terminal of the reference voltage circuit 310, and the other end of the switch 402 is connected to the first input terminal of the second voltage detection circuit 322. One end of the switch 403 is connected to a second output terminal of the reference voltage circuit 310, and the other end of the switch 403 is connected to the first input terminal of the first voltage detection circuit 321. One end of the switch 404 is connected to the second output terminal of the reference voltage circuit 310, and the other end of the switch 404 is connected to the first input terminal of the second voltage detection circuit 322. The rest of the configuration of the second embodiment is the same as the voltage abnormality detection circuit 300a according to the first embodiment.

Figure 5:
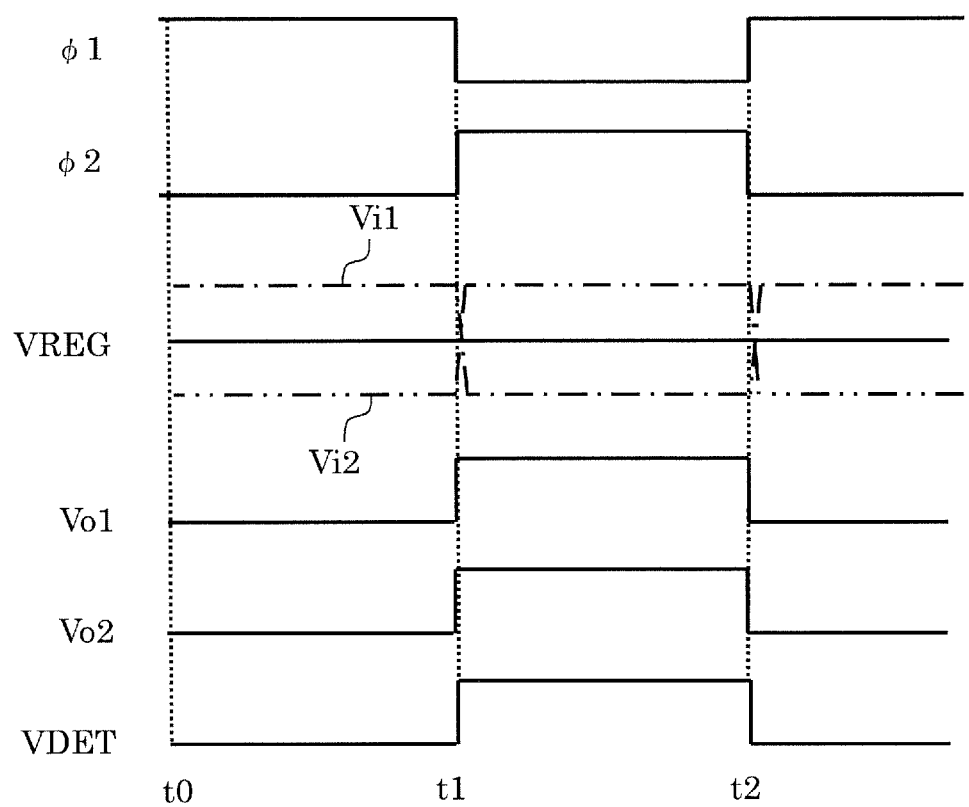
FIG. 5 is a timing chart for illustrating the operation of the voltage abnormality detection circuit according to the second embodiment.

The operation of the voltage abnormality detection circuit 300b according to the second embodiment is described next. FIG. 5 is a timing chart for illustrating the operation of the voltage abnormality detection circuit 300b according to the second embodiment.

A signal φ1 is used to control the switches 401 and 404, which are switched on when the signal φ1 is at the High level. A signal φ2 is used to control the switches 402 and 403, which are switched on when the signal φ2 is at the High level. The voltages of the input terminal 301 and the output terminal 302 in the voltage abnormality detection circuit 300b are denoted by VREG and VDET, respectively. The voltages of the first input terminal and the output terminal in the first voltage detection circuit 321 are denoted by Vi1 and Vo1, respectively. The voltages of the first input terminal and the output terminal in the second voltage detection circuit 322 are denoted by Vi2 and Vo2, respectively. The switches 331 and 332 are both switched on.

A case in which there is no abnormality in the voltage regulator 110 is considered first. During a period from a time t0 to a time t1 in FIG. 5, the switches 401 and 404 are switched on and the switches 402 and 403 are switched off. The NMOS transistor 351 and the PMOS transistor 361 in the first voltage detection circuit 321 are accordingly turned on when Vi1−VREG>Vth holds, thereby setting the voltage Vo1 to the Low level. In the second voltage detection circuit 322, the NMOS transistor 352 is turned off and the PMOS transistor 362 is turned off because Vi2−VREG<Vth holds, thereby setting the voltage Vo2 to the Low level. The detection voltage VDET is consequently at the Low level.

In a period from the time t1 to a time t2 in FIG. 5, the switches 401 and 404 are switched off and the switches 402 and 403 are switched on. The voltage Vi1 in this period is equal to the second reference voltage of the reference voltage circuit 310, and is lower than the constant voltage VREG. The voltage Vi2 in this period is equal to the first reference voltage of the reference voltage circuit 310, and is higher than the constant voltage VREG. Then Vi1−VREG<Vth holds, which means that the NMOS transistor 351 and the PMOS transistor 361 are turned off in the first voltage detection circuit 321, thereby setting the voltage Vo1 to the High level. The NMOS transistor 352 and the PMOS transistor 362 in the second voltage detection circuit 322 are turned on because Vi2−VREG>Vth holds, thereby setting the voltage Vo2 to the High level. The detection voltage VDET is consequently at the High level.

As described above, the voltage abnormality detection circuit 300b according to the second embodiment includes the switches 401, 402, 403, and 404, and can thus be tested, even when there is no voltage abnormality in the voltage regulator 110, to see whether the voltage abnormality detection circuit 300b is operating normally by switching the voltage Vi1 and the voltage Vi2.

The switches 331 and 332, which are supposed to be switched on in the description given above, may instead be controlled so as to be switched on only for a case in which the voltage regulator circuit should be monitored for the abnormality, which makes the semiconductor device consume less current.

While the switches 401 and 404 and the switches 402 and 403 are switched concurrently with the use of the signal φ1 and the signal φ2 in the description given above, the pairs of switches may instead be switched one pair at a time.

As described above, the voltage abnormality detection circuit of the present invention includes: the reference voltage circuit configured to output the first reference voltage, which is higher than the internal power supply voltage, and the second reference voltage, which is lower than the internal power supply voltage; the first voltage detection circuit to which the first reference voltage is input, and which is configured to detect that the internal power supply voltage has exceeded a desired voltage value; and the second voltage detection circuit to which the second reference voltage is input, and which is configured to detect that the internal power supply voltage has dropped lower than the desired voltage value. The voltage abnormality detection circuit can thus detect an abnormality in the internal power supply voltage output from the voltage regulator in the semiconductor device.

The semiconductor device in the descriptions of the embodiments uses a circuit that operates with the voltage of the power supply terminal 100 as a reference. The same effect can be obtained also when the semiconductor device uses a circuit that operates with the voltage of the power supply terminal 101 as a reference, by modifying the circuit configuration accordingly.

What is claimed is:

1. A voltage abnormality detection circuit configured to detect a voltage abnormality in an internal power supply voltage which is supplied by a voltage regulator to an internal circuit, the voltage abnormality detection circuit comprising:
   a reference voltage circuit configured to output a first reference voltage which is higher than the internal power supply voltage, and a second reference voltage which is lower than the internal power supply voltage;
   a first voltage detection circuit to which the first reference voltage is input, and which is configured to detect that the internal power supply voltage is higher than a first voltage value; and
   a second voltage detection circuit to which the second reference voltage is input, and which is configured to detect that the internal power supply voltage is lower than a second voltage value,
   wherein the first voltage detection circuit comprises:
      a first NMOS transistor in which the first reference voltage is input to a gate, and the internal power supply voltage is input to a source and a bulk; and
      a first constant current source connected between a drain of the first NMOS transistor and a power supply terminal,
   wherein the first voltage detection circuit is configured to detect that the internal power supply voltage is higher than the first voltage value when the first NMOS transistor is turned off,
   wherein the second voltage detection circuit comprises:
      a second NMOS transistor in which the second reference voltage is input to a gate, and the internal power supply voltage is input to a source and a bulk; and
      a second constant current source connected between a drain of the second NMOS transistor and a power supply terminal, and
   wherein the second voltage detection circuit is configured to detect that the internal power supply voltage is lower than the second voltage value when the second NMOS transistor is turned on.

2. The voltage abnormality detection circuit according to claim 1, further comprising a switch circuit sandwiched by the reference voltage circuit and by the first voltage detection circuit and the second voltage detection circuit,
   wherein an operation of the voltage abnormality detection circuit is tested by controlling the switch circuit so that the second reference voltage is input to the first voltage detection circuit whereas the first reference voltage is input to the second voltage detection circuit.

3. A semiconductor device, comprising:
   a voltage regulator configured to supply an internal power supply voltage to an internal circuit; and the voltage abnormality detection circuit of claim 1 to which the internal power supply voltage is input and which is configured to detect a voltage abnormality in the internal power supply voltage.

4. A semiconductor device, comprising:
a voltage regulator configured to supply an internal power supply voltage to an internal circuit; and
the voltage abnormality detection circuit of claim 2 to which the internal power supply voltage is input and which is configured to detect a voltage abnormality in the internal power supply voltage.

\* \* \* \* \*